(12) United States Patent
Chen et al.

(10) Patent No.: US 8,514,107 B2
(45) Date of Patent: Aug. 20, 2013

(54) METHOD AND DEVICE FOR ENCODING AND DECODING OF SYMBOL SEQUENCES WHEREIN EACH SYMBOL MAY HAVE ONE OUT OF THREE OR MORE POSSIBLE SYMBOL VALUES

(75) Inventors: Qu Qing Chen, Beijing (CN); Kang Ying Cai, Beijing (CN); Zhi Bo Chen, Beijing (CN); Jun Teng, Beijing (CN)

(73) Assignee: Thomson Licensing, Boulogne-Billcourt (FR)

( * ) Notice: Subject to any disclaimer, the term of this patent is extended or adjusted under 35 U.S.C. 154(b) by 57 days.

(21) Appl. No.: 13/138,717

(22) PCT Filed: Mar. 30, 2010

(86) PCT No.: PCT/EP2010/054257
§ 371 (c)(1),
(2), (4) Date: Sep. 21, 2011

(87) PCT Pub. No.: WO2010/115789
PCT Pub. Date: Oct. 14, 2010

(65) Prior Publication Data
US 2012/0019403 A1      Jan. 26, 2012

(30) Foreign Application Priority Data
Apr. 9, 2009   (EP) ..................................... 09305308

(51) Int. Cl.
*H03M 7/30*          (2006.01)
(52) U.S. Cl.
USPC ............................. 341/50; 345/423

(58) Field of Classification Search
USPC ................................ 341/50, 55, 63; 345/423
See application file for complete search history.

(56) References Cited

U.S. PATENT DOCUMENTS 6,909,384 B2 *   6/2005   Baldwin et al. .................. 341/55
7,263,238 B2 *   8/2007   Singh ............................ 382/244

FOREIGN PATENT DOCUMENTS

WO   WO2004040517   5/2004

OTHER PUBLICATIONS

Szymczak et al., "An Edgebreaker-based Efficient Compression Scheme for Regular Meshes", Computational Geometry, Theory and Applications, vol. 20, No. 1-2, Amsterdam, NL, Jan. 1, 2001, pp. 53-68.
Peng et al., "Technologies for 3D Mesh Compression: A Survey", Journal of Visual Communication and Image Representation, vol. 16, No. 6, Dec. 1, 2005, pp. 688-733.
Search Report Dated May 28, 2010.

* cited by examiner

*Primary Examiner* — Howard Williams
(74) *Attorney, Agent, or Firm* — Robert D. Shedd; Paul P. Kiel; Xiaoan Lu

(57) ABSTRACT

A method for compressing a symbol sequence, wherein each symbol may have one out of three or more possible symbol values, said method comprises the steps of modifying the symbol sequence by replacing each run pair, which contains a first run of symbols of a most frequent symbol value and a second run of symbols of a second most frequent symbol value, by a further symbol value not comprised in the three or more possible symbol values, generating a binary sequence comprising all replaced run pairs and compression encoding the binary sequence and the modified symbol sequence.

5 Claims, No Drawings

METHOD AND DEVICE FOR ENCODING AND DECODING OF SYMBOL SEQUENCES WHEREIN EACH SYMBOL MAY HAVE ONE OUT OF THREE OR MORE POSSIBLE SYMBOL VALUES

This application claims the benefit, under 35 U.S.C. §365 of International Application PCT/EP2010/054257, filed Mar. 30, 2010, which was published in accordance with PCT Article 21(2) on Oct. 14, 2010 in English and which claims the benefit of European patent application No. 09305308.0, filed Apr. 9, 2009.

TECHNICAL FIELD

The invention is made in the technical field of encoding and decoding of symbol sequences wherein each symbol may have one out of three or more possible symbol values.

BACKGROUND

Three-dimensional (3D) meshes have been widely used in various applications to represent 3D objects, including game, engineering design, architectural walkthrough, virtual reality, e-commerce, and scientific visualization. Their raw representation usually requires a huge amount of data, especially with the rapid growth of 3D scanners in recent years. However, most applications demand compact representation of 3D meshes for storage and transmission.

Typically, 3D meshes are represented by three types of data:

Topology data, which describe the adjacency relationship between vertices; it is also called connectivity data somewhere else. Geometry data, which specify vertex locations and property data, which specify attributes such as the normal vector, material reflectance, and texture coordinates.

Topology data and geometry data may be compressed commonly or separately. The coding order of geometry data is determined by the underlying topology coding. Geometry data is usually compressed by three main steps, quantization, prediction, and entropy coding. 3D mesh property data are usually compressed by the similar method of geometry compression.

Among the methods to encode topology data of 3D triangle meshes, Edgebreaker is a quite efficient and popularly used one proposed by J. Rossignac in: "Edgebreaker: Connectivity compression for triangle meshes," IEEE Transactions on Visualization and Computer Graphics, Vol. 5, No. 1, pp. 47-61, January-March 1999.

For large meshes, Edgebreaker and entropy coding can yield less than 1.5 bits per triangle. Edgebreaker's compression and decompression processes perform identical traversals of the mesh from one triangle to an adjacent one. At each stage, compression produces bits to describe the topological relation between the current triangle and the boundary of the already encoded part of the mesh. Decompression decodes these bits to reconstruct the entire topology graph. By using Edgebreaker algorithm, all the topology data of 3D triangle mesh are a series of five possible mode symbols: "C", "R", "L", "E", and "S". For example, the final output of Edgebreaker algorithm looks like: "CCRRRSLCRSERRELCR-RRCRRRE . . . "

Three of the five possible mode symbols of 3D mesh by Edgebreaker—"L" "E" "S"—do not occur as frequently as the other two symbols—"C" "R"—do. For example: CRCRCRCRCLRECCRCRCRRCRLCCRR-CRCRRCCRCRCCRSRCRCRCRRCRCR . . .

For example, the occurrences of the 5 modes in a couple of 3D mesh models:

TABLE 1

Statistical result of the occurrences of the five modes 'CRLES' in different 3D models

| Modes | (a) Hall | (b) VIP Room | (c) Viewing room | (d) Projector | (e) Water Machine | (f) Laptop | (g) PDA |
|---|---|---|---|---|---|---|---|
| C | 31489 (46.9%) | 124811 (47.4%) | 94529 (48.4%) | 21039 (49.5%) | 21103 (49.1%) | 2799 (46.6%) | 12749 (49.9%) |
| R | 28724 (42.7%) | 115672 (43.9%) | 88442 (45.3%) | 19672 (46.3%) | 20378 (47.3%) | 2711 (45.2%) | 12082 (47.3%) |
| L | 2491 (3.7%) | 8479 (3.2%) | 4174 (2.1%) | 1147 (2.7%) | 246 (0.6%) | 74 (1.2%) | 435 (1.7%) |
| E | 3177 (4.7%) | 9621 (3.7%) | 4662 (2.4%) | 343 (0.8%) | 731 (1.7%) | 259 (4.3%) | 148 (0.6%) |
| S | 1352 (2.0%) | 4723 (1.8%) | 3632 (1.9%) | 285 (0.7%) | 552 (1.3%) | 160 (2.7%) | 137 (0.5%) |
| Total | 67233 (100%) | 263306 (100%) | 195439 (100%) | 42486 (100%) | 43010 (100%) | 6003 (100%) | 25551 (100%) |

INVENTION

The invention proposes a method to remove the statistical redundancy within multi-symbol sequence, for instance as representative for topology data of 3D mesh models after Edgebreaker algorithm.

It first combines some symbols into a new symbol, and then encodes the new symbol together with other symbols using a certain context model. If the new symbol is encoded, then the details of the combinations are encoded next, wherein several context models are used for different positions in "runs" of each symbol.

A method for compressing a symbol sequence is proposed, wherein each symbol may have one out of three or more possible symbol values, said method comprises the steps of modifying the symbol sequence by replacing each run pair, which contains a first run of symbols of a most frequent symbol value and a second run of symbols of a second most frequent symbol value, by a further symbol value not comprised in the three or more possible symbol values, generating a binary sequence comprising all replaced run pairs and compression encoding the binary sequence and the modified symbol sequence.

Further, a binary representation of a symbol sequence is proposed wherein each symbol may have one out of n possible symbol values, n>2, and wherein said symbol sequence is represented by a binary representation of a modified symbol sequence and a binary representation of a binary sequence wherein the symbols of the modified symbol sequence may have one out of (n−1) possible symbol values.

And, a storage medium carrying such bit stream is proposed.

In an embodiment, the following method is applied for compression encoding the binary sequence:

Generating an other bit sequence by flipping bits of the binary sequence, wherein only those bits flipped which are immediately preceded in the binary sequence by a respective preceding bit having a first of two possible bit values, and encoding the other bit sequence.

In another embodiment, compression encoding the binary sequence may comprise generating a first sequence of unary representations of lengths of runs of Ones, generating a second sequence of unary representations of lengths of runs of Zeroes, and bit plane encoding the generated first and second sequence of unary representations.

For decoding the symbol sequence, the modified symbol sequence is decoded and the binary sequence is decoded. Then, each occurrence of the further symbol in the modified symbol sequence is replaced by a run pair comprised in the binary sequence wherein the order of the run pairs in the binary sequence equals the order of the run pairs after replacement of said further symbols in the modified symbol sequence.

The binary sequence may be decoded by decoding other bit sequence, and generating the binary sequence by flipping bits of the other bit sequence, wherein each flipped bit is immediately preceded in the binary sequence by a respective preceding bit having a first of two possible bit values.

EXEMPLARY EMBODIMENTS

Exemplary Embodiment 1

An exemplary Encoder is adapted for encoding in two steps:

Step 1—First Level:

First, all the "C . . . CR . . . R" combinations also called words, each word consisting of a run of "C" followed by a run of "R" (or each word consisting of a run of "C" preceded by a run of "R") are found. Then, each word is replaced by a same symbol, e.g., "A", independent from the length of the runs of which a particular word consists. The resulting Symbol sequence is encoded, subsequently.

For example,
CRCRCRCRCLRECCRCRCRRCRLCCRR-
CRCRRCCRCRCCRSRCRCRCRRCRCR . . . .

Will be changed into:
AAAACLREAAAALAAAAAASRAAAAA . . .

Note: the way to group:
(CR)(CR)(CR)(CR)CLRE(CCR)(CR)(CRR)(CR)L(CCRR) (CR)(CRR)(CCR)   (CR)(CCR)SR(CR)(CR)(CRR)(CR) (CR) . . .

Here "A" only means a group of "C . . . CR . . . R" and the number of "C" and the number of "R" is not fixed but bigger than "0". If there is a separated "C", e.g., the "C" before "L", then keep "C" as itself. If there is a separated "R", e.g., the "R" before the "E" and the "R" after "S", then also keep it.

In this step, the new series with 6 symbols:
"C" "R" "L" "E" "S" "A" will be encoded by entropy coding method.

Step 2—Second Level:

If an "A" is encoded, then the combinations of "C . . . CR . . . R" is followed to be encoded, which encode the runs of "C" and the runs of "R" by different context models.

This step can be concatenated with step (1), so that the encoder can encode the symbol series by only one pass. Also the decoder can decode the bitstream by one pass.

Pseudo-Code of an Exemplary Embodiment of Encoder:

The pseudo-code of the above two steps can be presented as a state machine:

```
// sym: current symbol
// prev_sym: previous symbol(s)
prev_sym='C';
run_c=run_r=0;
for(i=0; i<Total_Number_of_Input_Symbols; i++) {
    sym = Read_one_symbol( );
    switch(sym) {
    case 'C':
        if(prev_sym==sym) //CC..C
            run_c++;
        else { //CC..CRR..RC or ..EC
            encode_ prev_sym(run_c, run_r, prev_sym, Context_Model);
            prev_sym=sym;
            run_c=1; run_r=0;
        }
        break;
    case 'R':
        if(prev_sym==sym || prev_sym=='A') //ERR..R or CC..CRR..R
            run_r++;
        else if(prev_sym == 'C') { //CC..CR
            run_r=1;
            prev_sym=='A'
        }
        else { // LR or ER or SR
            encode_ prev_sym(run_c, run_r, prev_sym, Context_Model);
            prev_sym==sym;
            run_r=1; run_c=0;
        }
        break;
    default: //'L' 'E' 'S'
        encode_ prev_sym(run_c, run_r, prev_sym, Context_Model);
        prev_sym==sym;
        run_c=run_r=0;
    }
}
//encode the last symbol(s)
encode_prev_sym(run_c, run_r, prev_sym, Context_Model);
//////////////////////////////////////////////////
//////////////////////////////////////////////////
// For function: encode_prev_sym(run_c, run_r, prev_sym, Context_Model)
//////////////////////////////////////////////////
//////////////////////////////////////////////////
// First level: Context Model 0: for "C" "R" "L" "E" "S" "A"
// Second level: Context Model 2i+1 (i=0,1,2,...): for "CC...RR...R", run_c=i;
// Second level: Context Model 2i+2 (i=0,1,2,...): for "CC...RR...R", run_r=i;
encode_prev_sym(run_c, run_r, prev_sym, Context_Model)
{
    switch (prev_sym) {
    case 'A':
        //First encode "A"
        ac_encode_symbol (Context_Model[0], prev_sym);
        //Then encode CC..CR...RC...R with different
        //context model based on run_c and run_r
        for(i=0;i<run_c-1;i++)   {//And  then  encode "CC...C"
            ac_encode_symbol (Context_Model[2i+1], 1);
        }
        ac_encode_symbol (Context_Model[2i+1], 0);
```

-continued

```
        for(i=0;i<run_r-1; i++) {//And then encode "RR...R"
            ac_encode_symbol (Context_Model[2i+2], 1);
        }
        ac_encode_symbol (Context_Model[2i+2], 0);
        break;
    case 'C':
        for(i=0;i<run_c;i++)  {//And  then  encode "CC...C"
            ac_encode_symbol       (Context_Model[0],
prev_sym);
        }
        break;
    case 'R':
        for(i=0;i<run_r;i++) {//And then encode "CC...C"
            ac_encode_symbol       (Context_Model[0],
prev_sym);
        }
        break;
    default : //'L' 'E' 'S'
        ac_encode_symbol (Context_Model[0], prev_sym);
    }
}
```

Pseudo-Code of Decoder:

```
prev_sym = 'C';
run_c=run_r=0;
if (prev_sym!= 'A') {//Decode symbol of the first level:
context model 0
    dec_sym = ac_decode_symbol (Context_Model[0]);
    prev_sym = dec_sym;
}
if (prev_sym== 'A') { //Continue to decode the second
level: context model 1, 2, 3, ...
    if(run_r==0) { //The decoded symbol should be 'C'
        dec_sym='C';
        if(ac_decode_symbol  (Context_Model[2*run_c-1])==
'C')
            run_c++;
        else {  //'CC...C' ends, and 'R' begins
            run_c=0; run_r=1;
        }
    }
    else {  //The decoded symbol should be 'R'
        dec_sym = 'R';
        if(ac_decode_symbol     (Context_Model[2*run_r])==
'R'))
            run_r++;
        else { //'CC...CRR...R' ends.
            run_r=0;
            prev_sym = 'R'; //It can be any symbol other
than "A"
        }
    }
}
output(dec_sym);
```

Experimental Results:

TABLE 2

Comparison of different entropy coding method for Edgebreaker topology coding

| Model Name | VLC Coding (KB) | Arithmetic Coding (AC) (KB) | Proposed Method (KB) | Improvement: (AC − Proposed)/ AC * 100% |
|---|---|---|---|---|
| (a) Hall | 18.1 | 12.4 | 11.1 | 10.9% |
| (b) VIP Room | 71.2 | 46.7 | 42.7 | 8.5% |
| (c) Viewing room | 50.3 | 32.8 | 27.4 | 16.5% |
| (d) Projector | 10.7 | 6.5 | 4.1 | 36.5% |
| (e) Water Machine | 10.9 | 6.5 | 5.0 | 22.1% |
| (f) Laptop | 1.6 | 1.1 | 1.0 | 6.4% |
| (g) PDA | 6.4 | 3.7 | 2.0 | 47.1% |
| Average | | | | 21.1% |

Table 2 lists the compression result of topology data of the examples. Here VLC coding means that Huffman code is used. The proposed method is developed according to the Pseudo-code above.

It can be seen from the Table that the proposed method can achieve improvement of 6.4%-47.1% in compression ratio against the existing arithmetic coding.

A method is proposed which encodes symbols in two levels:

First treat some combination of some symbols (e.g., C . . . CR . . . R) as a new symbol (e.g., A), and encode the new symbol together with existing other symbols (e.g., CRLESA) by a certain context model (e.g., context model 0).

The second level if the new symbol (e.g., A) appears, then following the new symbol its corresponding original symbol combinations (C . . . CR . . . R) will be encoded by a series of other context models (e.g., context mode 2*i+1, context model 2*i+2).

Accordingly, the redundancy lying in the "run"s of the symbols in the combinations (e.g., CRCRCCRCRCRC RR . . . ) will be removed.

Entropy coding method is a fundamental process in data compression. The proposed method can be used in practice for the definition of transmission standards, for instance.

It should be understood that the exemplary embodiments described above are for illustrative purposes only and that they shall not be interpreted as in any way limiting the spirit and scope of the invention for which protection is sought, said scope being solely defined by the claims.

In particular, the invention is not at all limited to spatial data but applicable to all kind of data comprising file data or measurement data, for instance.

The invention claimed is:

1. A method for compressing a symbol sequence, wherein each symbol has one out of three or more possible symbol values, said method comprising the steps of:
   modifying the symbol sequence by replacing each run pair, which contains a first run of symbols of a most frequent symbol value immediately followed by a second run of symbols of a second most frequent symbol value, by a further symbol value being different from the three or more possible symbol values;
   generating a binary sequence comprising the replaced run pairs; and
   encoding the binary sequence and the modified symbol sequence.

2. A encoder for performing the method of claim 1.

3. A non-transitory storage medium carrying a symbol sequence compress encoded according to the method of claim 1.

4. A method for decompressing a compressed symbol sequence, wherein each symbol has one out of three or more possible symbol values, said method comprising the steps of:

decoding a different symbol sequence, said different symbol sequence comprising symbols of a further symbol value being different from the three or more possible symbol values, and decoding a sequence of run pairs comprised in a binary sequence, the number of run pairs in the sequence of run pairs equalling the number of symbols of said further symbol value in the different symbol sequence, wherein a run pair contains a first run of symbols of a symbol value immediately followed by a second run of symbols of a second symbol value; and replacing, in the different sequence, the symbols of said further symbol value by the run pairs wherein order of the run pairs is maintained.

5. A decoder for performing the method of claim 4.

* * * * *